(12) United States Patent
He et al.

(10) Patent No.: US 8,227,300 B2
(45) Date of Patent: Jul. 24, 2012

(54) SEMICONDUCTOR SWITCHING CIRCUIT EMPLOYING QUANTUM DOT STRUCTURES

(75) Inventors: Zhong-Xiang He, Essex Junction, VT (US); Qizhi Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 12/632,839

(22) Filed: Dec. 8, 2009

(65) Prior Publication Data

US 2010/0237324 A1   Sep. 23, 2010

Related U.S. Application Data

(60) Provisional application No. 61/161,109, filed on Mar. 18, 2009.

(51) Int. Cl.
*H01L 21/762* (2006.01)

(52) U.S. Cl. ........ 438/149; 438/154; 438/311; 438/479; 257/E21.561

(58) Field of Classification Search .................. 438/149, 438/154, 479, 311, 517
See application file for complete search history.

(56) References Cited

U.S. PATENT DOCUMENTS

| | | | |
|---|---|---|---|
| 5,828,076 A | 10/1998 | Gossner et al. | |
| 5,963,471 A | 10/1999 | Ohata et al. | |
| 6,211,013 B1 | 4/2001 | Park et al. | |
| 6,545,359 B1 * | 4/2003 | Ohtani et al. | 257/758 |
| 6,734,105 B2 | 5/2004 | Kim | |
| 6,800,511 B2 | 10/2004 | Park et al. | |
| 7,005,700 B2 | 2/2006 | Lee | |
| 7,026,642 B2 | 4/2006 | Sandhu | |
| 7,217,620 B2 | 5/2007 | Koh | |
| 7,244,679 B2 | 7/2007 | Koh | |
| 2003/0038315 A1 | 2/2003 | Skotnicki et al. | |
| 2005/0227444 A1 | 10/2005 | Ponomarev et al. | |
| 2007/0200167 A1 * | 8/2007 | Yamazaki | 257/324 |

FOREIGN PATENT DOCUMENTS

| | | |
|---|---|---|
| JP | 5055545 | 3/1993 |
| JP | 5095111 | 4/1993 |
| JP | 2005203441 | 7/2005 |
| WO | WO 02/21600 | 3/2002 |

OTHER PUBLICATIONS

Leobandung et al., "Silicon Single Hole Quantum Dot Transistors for Complementary Digital Circuits", IEEE, 1995.

* cited by examiner

*Primary Examiner* — Thanh Nguyen
(74) *Attorney, Agent, or Firm* — Scully, Scott, Murphy & Presser, P.C.; Anthony J. Canale

(57) ABSTRACT

A semiconductor circuit includes a plurality of semiconductor devices, each including a semiconductor islands having at least one electrical dopant atom and located on an insulator layer. Each semiconductor island is encapsulated by dielectric materials including at least one dielectric material portion. Conductive material portions, at least one of which abut two dielectric material portions that abut two distinct semiconductor islands, are located directly on the at least one dielectric material layer. At least one gate conductor is provided which overlies at least two semiconductor islands. Conduction across a dielectric material portion between a semiconductor island and a conductive material portion is effected by quantum tunneling. The conductive material portions and the at least one gate conductor are employed to form a semiconductor circuit having a low leakage current. A design structure for the semiconductor circuit is also provided.

12 Claims, 13 Drawing Sheets

SEMICONDUCTOR SWITCHING CIRCUIT EMPLOYING QUANTUM DOT STRUCTURES

FIELD OF THE INVENTION

The present invention relates to a semiconductor circuit employing quantum dot structures and methods of manufacturing the same.

BACKGROUND

As dimensions of semiconductor devices scale down to nanometer scale, quantum effects are manifested in semiconductor devices. One type of quantum effect is quantization of electrical charges in the volume of the semiconductor device. For example, a semiconductor cube having a dimension of about 21.5 nm on each side has a total volume of about $10^4$ nm$^3$, which is $10^{-17}$ cm$^3$. If the semiconductor cube has a dopant concentration of $10^{17}$ atoms/cm$^3$, a single dopant atom is present in the volume of the semiconductor cube. Dopant concentration levels from about $10^{15}$ atoms/cm$^3$ to about $10^{21}$ atoms/cm$^3$, which are typically employed in semiconductor devices, correspond to numbers of dopant atoms from about $10^{-2}$ to about $10^4$ in such a semiconductor cube.

By forming an isolated semiconductor island having dimensions on the order of tens of nanometers and providing a suitable doping level in the semiconductor material, the number of electrical charges in the isolated semiconductor island may be a single digit number or double digit numbers. In such a structure, quantization of electrical charge is reflected in electrical characteristics of the isolated semiconductor island. Such structures are referred to as "quantum dot" structures in which states of excitons are spatially bound in nanoscale dimensions and display quantum effects.

Scaling of conventional field effect transistors having source and drain regions that abut a body region having an opposite type of doping than the source and drain regions suffer from leakage current in an off state. As the dimensions of the field effect transistor scale down, the off-state leakage current increases. The problem becomes even more complicated when the operational voltage of the field effect transistor is also reduced. Since the voltage swing on the gate of the field effect transistor has a small magnitude, e.g., less than 1.2 V, the ratio between the on-current and the off-current of the transistor decreases with the scaling of physical dimensions and reduction of the operational voltage. A semiconductor circuit containing such field effect transistors consumes a large amount of power even in an off-state. Thus, semiconductor circuits containing conventional field effect transistors face tremendous difficulty in reducing power as the dimensions of semiconductor devices scale down.

In view of the above, there exists a need for a semiconductor circuit that offers an equivalent functionality of complementary metal-oxide-semiconductor (CMOS) circuits while providing a low leakage current below the level of scaled-down versions of semiconductor circuits employing conventional metal-oxide-semiconductor field effect transistors (MOSFETs), and methods of manufacturing the same.

BRIEF SUMMARY

The present invention provides a semiconductor circuit that employs a plurality of semiconductor devices that provide electronic switching employing a quantum dot structure.

The semiconductor circuit of the present invention includes a plurality of semiconductor devices, each including a semiconductor islands having at least one electrical dopant atom and located on an insulator layer. Each semiconductor island is encapsulated by dielectric materials including at least one dielectric material portion. The at least one dielectric material layer includes portions having a thickness less than 2 nm to enable quantum tunneling effects. Conductive material portions, at least one of which abut two dielectric material portions that abut two distinct semiconductor islands, are located directly on the at least one dielectric material layer. At least one gate conductor is provided which overlies at least two semiconductor islands. Conduction across a dielectric material portion between a semiconductor island and a conductive material portion is effected by quantum tunneling. The conductive material portions and the at least one gate conductor are employed to form a semiconductor circuit having a low leakage current. An inverter, a NAND gate, a NOR gate, or logic gates similar to the logic gates employed in metal-semiconductor-oxide field effect transistor (MOSFET) circuits may be formed. A design structure for the semiconductor circuit is also provided.

In the present invention, a plurality of semiconductor islands, each including at least one electrical dopant atom, is formed on an insulator layer. Each semiconductor island is encapsulated by dielectric materials including at least one dielectric material portion. The at least one dielectric material layer includes portions having a thickness less than 2 nm to enable quantum tunneling effects. A conductive material is deposited directly on the at least one dielectric material layer and patterned to form conductive material portions, at least one of which abut two dielectric material portions that abut two distinct semiconductor islands. At least one gate conductor, each overlying at least two semiconductor islands, is formed. Conduction across a dielectric material portion between a semiconductor island and a conductive material portion is effected by quantum tunneling. The conductive material portions and the at least one gate conductor are employed to form a semiconductor circuit having a low leakage current.

According to an aspect of the present invention, a method of forming a semiconductor structure is provided, which comprises: forming first and second semiconductor portions, each including at least one dopant atom, on an insulator layer; forming a first dielectric material layer directly on the first semiconductor portion and a second dielectric material layer directly on the second semiconductor portion, wherein the insulator layer and the first dielectric material layer encapsulate the first semiconductor portion, and wherein the insulator layer and the second dielectric material layer encapsulate the second semiconductor portion; forming a conductive material portion directly on a portion of the first dielectric material layer and a portion of the second dielectric material layer, wherein the first and second dielectric material layers have a thickness less than 2 nm to enable quantum tunneling of electrical current into or from the conductive material portion; and forming a gate conductor of unitary construction directly on a top surface of the first dielectric material layer, a top surface of the second dielectric material layer, and a top surface of the insulator layer.

According to another aspect of the present invention, a semiconductor structure is provided, which comprises: first and second semiconductor portions, each including at least one dopant atom and encapsulated by dielectric materials, wherein the dielectric materials include an insulator layer located directly beneath the first and second semiconductor portions, a first dielectric material layer abutting the first semiconductor portion, and a second dielectric material layer abutting the second dielectric material portion; a gate conductor vertically abutting a top surface of the first dielectric material layer, a top surface of the second dielectric material layer, and a top surface of the insulator layer; and a conductive material portion abutting a portion of the first dielectric material layer and a portion of the second dielectric material layer, wherein the first and second dielectric material layers have a thickness less than 2 nm to enable quantum tunneling of electrical current into or from the conductive material portion.

According to yet another aspect of the present invention, a design structure embodied in a machine readable medium for designing, manufacturing, or testing a design for a semiconductor structure is provided. The design structure comprises: a first data representing an insulator layer; a second data representing a first semiconductor portion including at least one dopant atom and located directly above the insulator layer; a third data representing a first dielectric material layer, wherein the first semiconductor portion is encapsulated by the insulator layer and the first dielectric material layer; a fourth data representing a second semiconductor portion including at least one dopant atom and located directly above the insulator layer; a fifth data representing a second dielectric material layer, wherein the second semiconductor portion is encapsulated by the insulator layer and the second dielectric material layer; a sixth data representing a gate conductor vertically abutting a top surface of the first dielectric material layer, a top surface of the second dielectric material layer, and a top surface of the insulator layer; and a seventh data representing a conductive material portion abutting a portion of the first dielectric material layer and a portion of the second dielectric material layer, wherein the first and second dielectric material layers have a thickness less than 2 nm to enable quantum tunneling of electrical current into or from the conductive material portion.

BRIEF DESCRIPTION OF THE SEVERAL VIEWS OF THE DRAWINGS

For all of the figures herein, the following conventions apply. Figures with the same numeric label correspond to the same stage of manufacturing. Figures with the suffix "A" are top-down views. Figures with the suffix "B" are horizontal cross-sectional views along the plane B-B' of the corresponding figure with the same numeric label and the suffix "A."

DETAILED DESCRIPTION

As stated above, the present invention relates to a semiconductor circuit for providing protection against electrical overstress (EOS) and a design structure for the same, which are described herein with accompanying figures. The drawings are not necessarily drawn to scale.

Figure 1A:
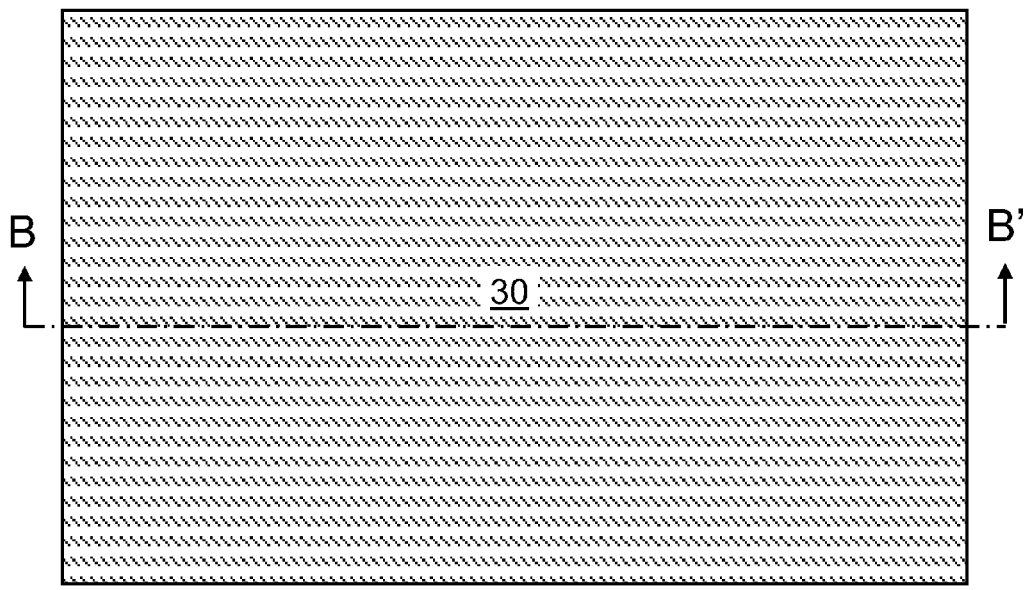
FIGS. 1A-11B are sequential views of a first exemplary semiconductor structure according to the present invention at various stages of a manufacturing process.
Figure 1B:
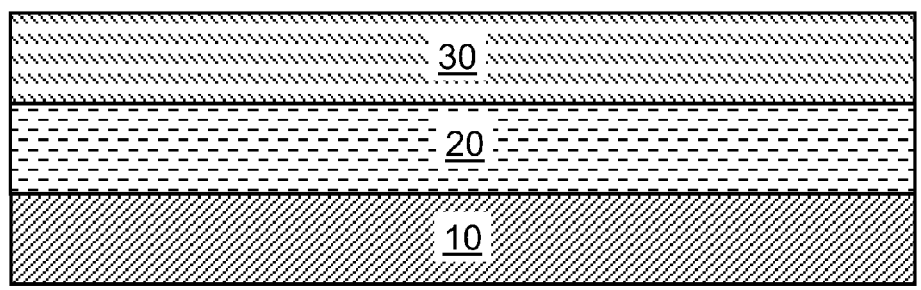

Referring to FIGS. 1A and 1B, a first exemplary semiconductor structure according to the present invention comprises a semiconductor-on-insulator (SOI) substrate comprising a handle substrate 10, a buried insulator layer 20, and a top semiconductor layer 30. The handle substrate 10 may comprise a semiconductor material, an insulator material, or a metallic material. For example, the handle substrate may comprise single crystalline semiconductor material such as silicon. The buried insulator layer 20 comprises a dielectric material such as silicon oxide or silicon nitride. The top semiconductor layer 30 comprises a semiconductor material. Preferably, the semiconductor layer 30 comprises a single crystalline semiconductor material having an epitaxial alignment among atoms within the entirety of the semiconductor layer 30. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. The thickness of the top semiconductor layer 30 may be from about 5 nm to about 200 nm, and typically from about 10 nm to about 100 nm, although lesser and greater thicknesses are also contemplated herein.

Figure 2A:
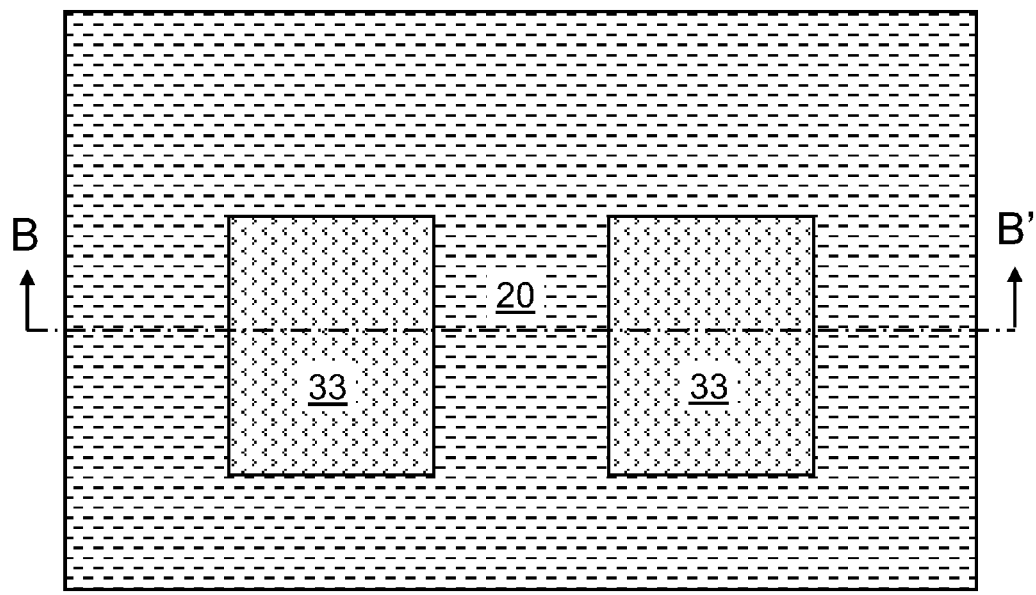
Figure 2B:
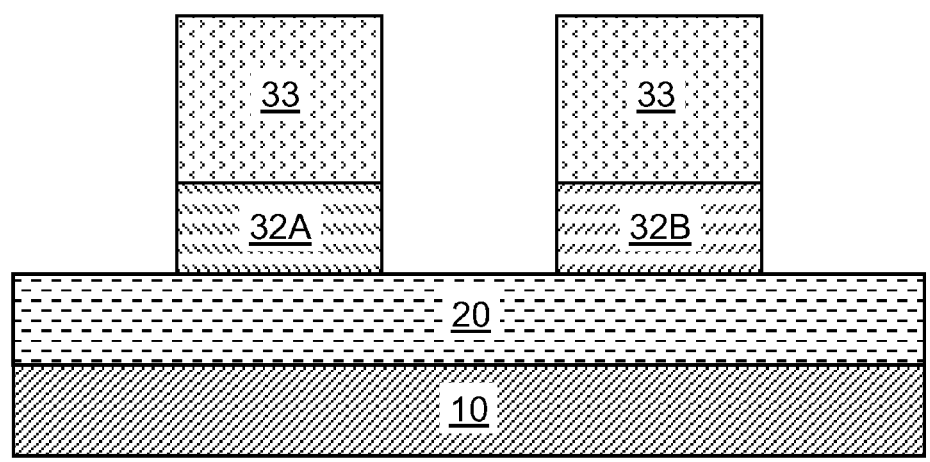

Referring to FIGS. 2A and 2B, a photoresist 33 is applied over the top surface of the top semiconductor layer 30. The photoresist 33 is lithographically patterned to define a plurality of islands of the photoresist 33. The pattern in the photoresist 33 is transferred into the top semiconductor layer 30 by an etch, which may be an anisotropic etch such as a reactive ion etch (RIE). The etch proceeds to the top surface of the buried insulator layer 20. A plurality of semiconductor portions corresponding to the pattern in the photoresist 33 is formed by the remaining portions of the top semiconductor layer 30. The plurality of semiconductor portions includes a first semiconductor portion 32A and a second semiconductor portion 32B.

The volume of each of the semiconductor portions (32A, 32B) may be from about $10^2$ nm$^3$ to about $10^9$ nm$^3$, and preferably from about $10^3$ nm$^3$ to about $10^7$ nm$^3$, although lesser and greater volumes are also contemplated herein. Typical lateral dimensions, e.g., length and width, of each of the semiconductor portions (32A, 32B) may be from about 5 nm to about 2,000 nm, and typically from about 10 nm to about 100 nm, although lesser and greater dopant concentrations are also contemplated herein. The photoresist 33 is subsequently removed.

Each of the semiconductor portions may be doped with electrical dopants of p-type or n-type. Block level masks may be employed to selectively dope some semiconductor portions, while blocking other semiconductor portions. For example, the first semiconductor portion 32A may be doped with dopants of a first conductivity type, and the second semiconductor portion 32B may be doped with dopants of a second conductivity type, in which the second conductivity type is the opposite of the first conductivity type. For p-type doping, the electrical dopants may be at least one of p-type dopants such as B, Ga, and In. For n-type doping, the electrical dopants may be at least one of n-type dopants such as P, As, and Sb. Typically, the concentration of the electrical dopants may be from about $1.0 \times 10^{14}$ atoms/cm$^3$ to about $1.0 \times 10^{19}$ atoms/cm$^3$ in each of the semiconductor portions (32A, 32B), although lesser and greater concentrations are also contemplated herein.

The total number dopant atoms in each semiconductor portion (32A or 32B) is obtained by multiplying the volume of the semiconductor portion (32A or 32B) and the dopant concentration of the semiconductor portion (32A or 32B). For each semiconductor portion (32A or 32B), the total number of dopants is less than about 100, i.e., from 1 to about 100. The total number of dopants may be from 1 to about 50, and typically from about 10 to about 25.

Figure 3A:
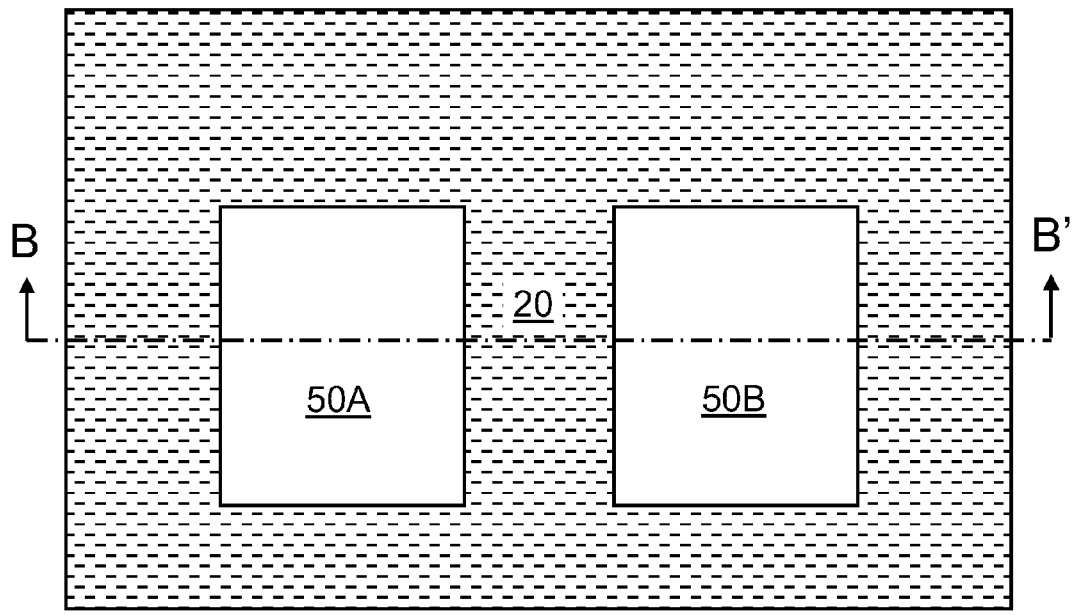
Figure 3B:
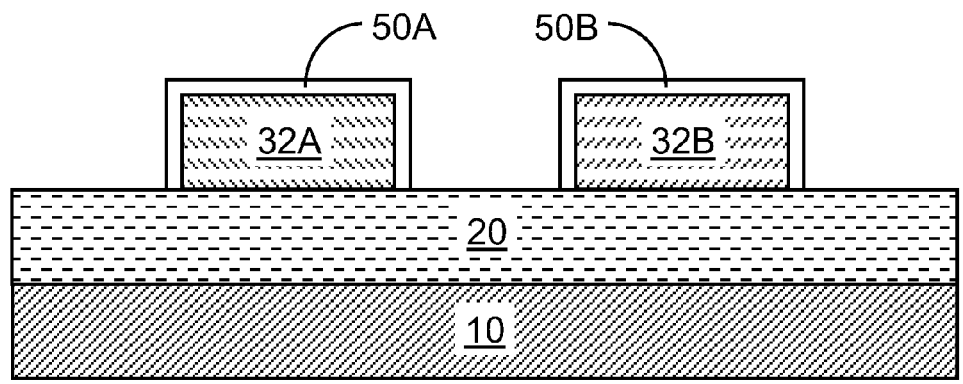

Referring to FIGS. 3A and 3B, dielectric material layers (50A, 50B) are formed on the exposed surfaces of the semiconductor portions (32A, 32B). Specifically, a first dielectric material layer 50A is formed directly on the exposed surfaces of the first semiconductor portion 32A, and a second dielectric material layer 50B is formed directly on the exposed surfaces of the second semiconductor portion 32B. The buried insulator layer 20 and the first dielectric material layer 50A encapsulate the first semiconductor portion 32A, and the buried insulator layer 20 and the second dielectric material layer 50B encapsulate the second semiconductor portion 32B.

The dielectric material layers (50A, 50B) may comprise a semiconductor-based dielectric material such as silicon oxide, silicon nitride, silicon oxynitride, and/or a stack thereof. The semiconductor-based dielectric material may be formed by thermal conversion of exposed portions of the semiconductor portions (32A, 32B) and/or by chemical vapor deposition (CVD). Alternately, the dielectric material layers (50A, 50B) may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD), etc. In case the material of the dielectric material layers (50A, 50B) is deposited, the dielectric material layers (50A, 50B) are portions of a contiguous dielectric material layer of unitary construction, i.e., in one piece, that abuts the entirety of the top surfaces and sidewall surface of the semiconductor portions (32A, 32B) and exposed top surfaces of the buried insulator layer 20.

The thickness of the dielectric material layers (50A, 50B) may be from about 0.3 nm to about 2 nm to enable quantum tunneling of electrical current therethrough. Preferably, the thickness of the dielectric material layers (50A, 50B) is from about 0.5 nm to about 1.2 nm. Since the quantum tunneling of electrical current increases exponentially with the inverse of the thickness of a dielectric material portion, the control of the thickness of the dielectric material layers (50A, 50B) below 2 nm is needed to enable significant quantum tunneling current. Preferably, the thickness of the dielectric material layers (50A, 50B) is from about 0.5 nm to about 1.2 nm.

Figure 4A:
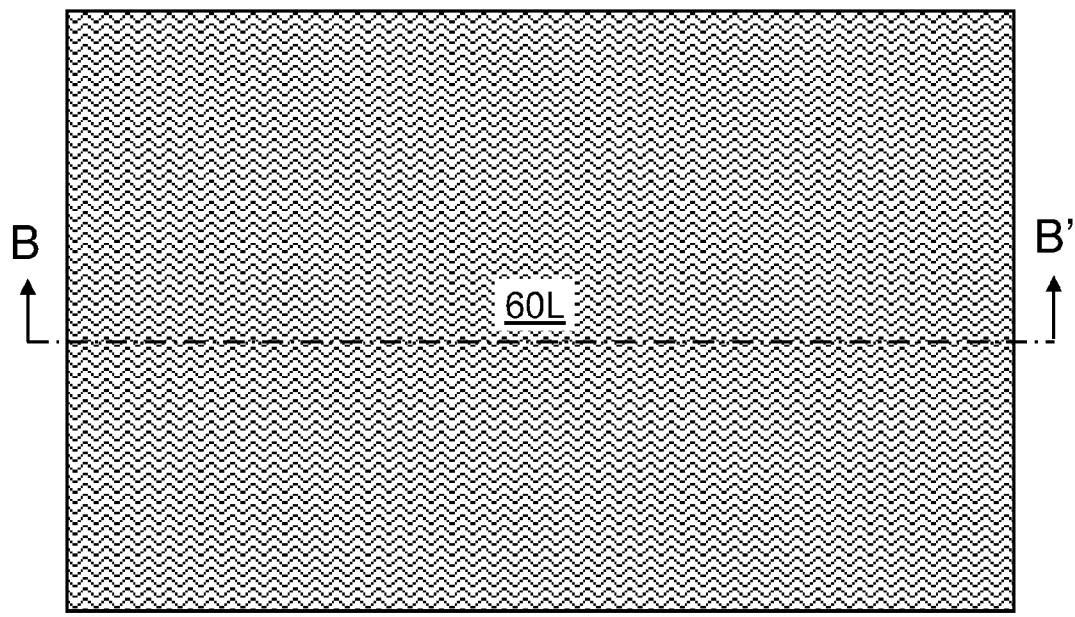
Figure 4B:
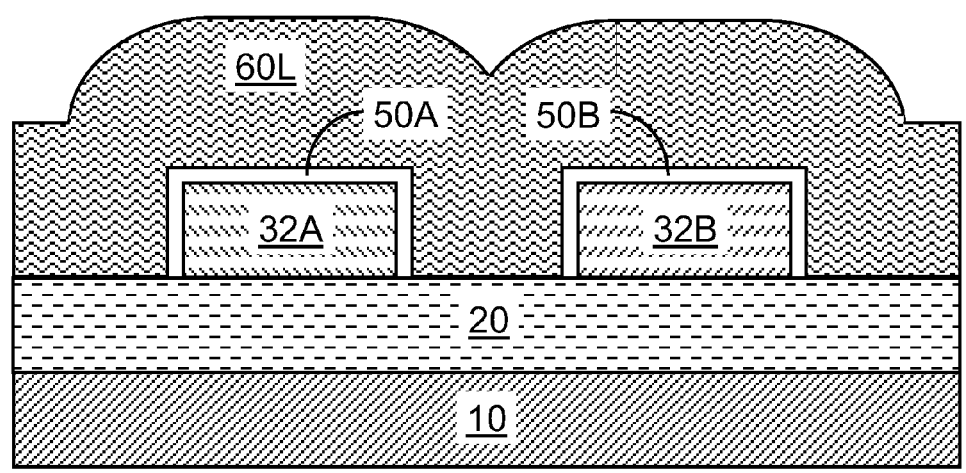

Referring to FIGS. 4A and 4B, a conductive material layer 60 is deposited over the top surfaces of the first exemplary semiconductor structure. The conductive material layer 60 comprises a conductive material such as a doped semiconductor material or a metallic material. For example, the conductive material layer 60 may comprise a doped semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Alternately or in addition, the conductive material layer 60 may comprises a metallic material such as conductive metallic nitrides, elemental metals, intermetallic alloys, and a combination thereof. The thickness of the conductive material layer 60, as measured directly above the top surface of the buried insulator layer 20, is greater than the sum of the thickness of the dielectric material layers (50A, 50B) and the thickness of the semiconductor portions (32A, 32B).

Figure 5A:
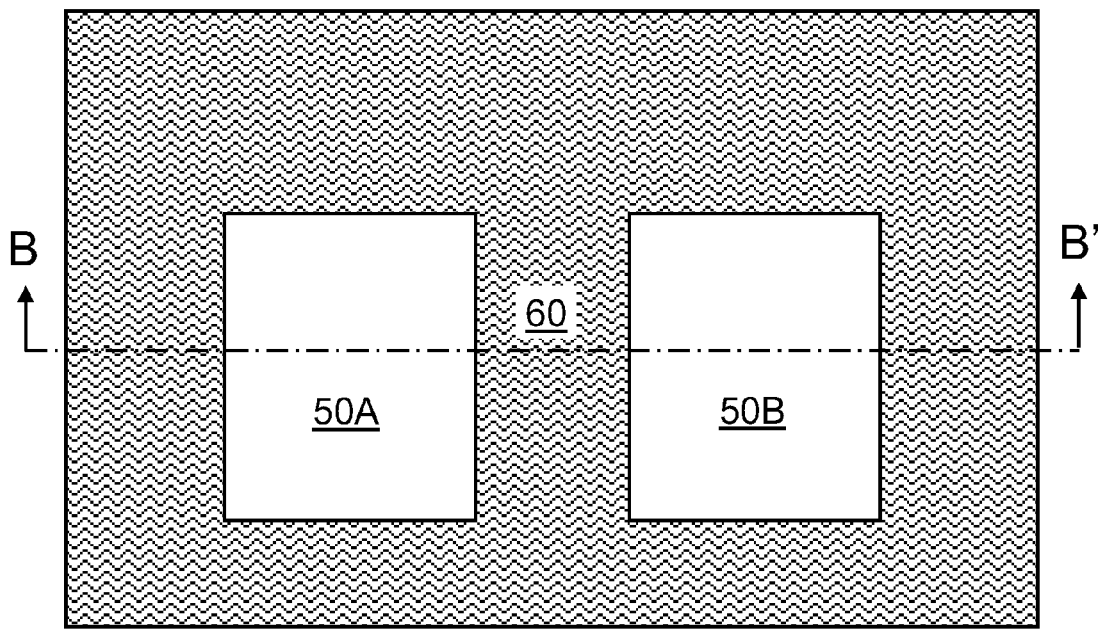
Figure 5B:
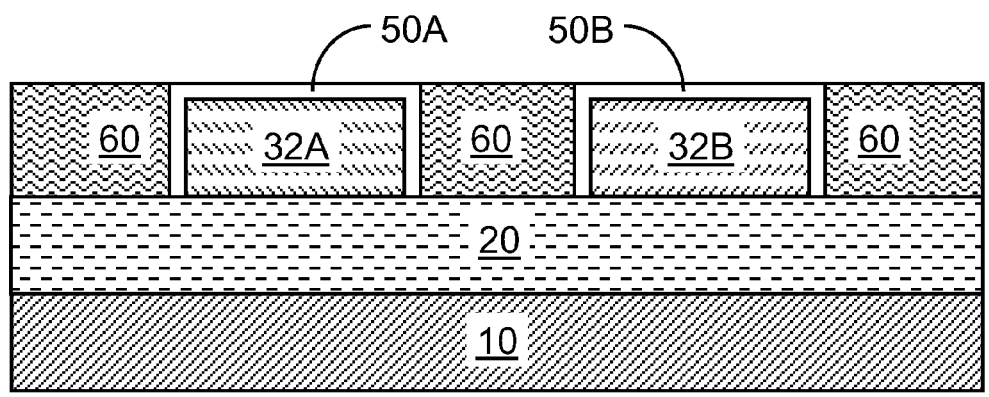

Referring to FIGS. 5A and 5B, the conductive material layer 60 is planarized. The top surfaces of the dielectric material layers (50A, 50B) may be employed as a stopping layer and/or an end-point detection layer. After planarization, the top surface of the conductive material layer 60 and the top surfaces of the dielectric material layers (50A, 50B) are substantially coplanar and horizontal.

Figure 6A:
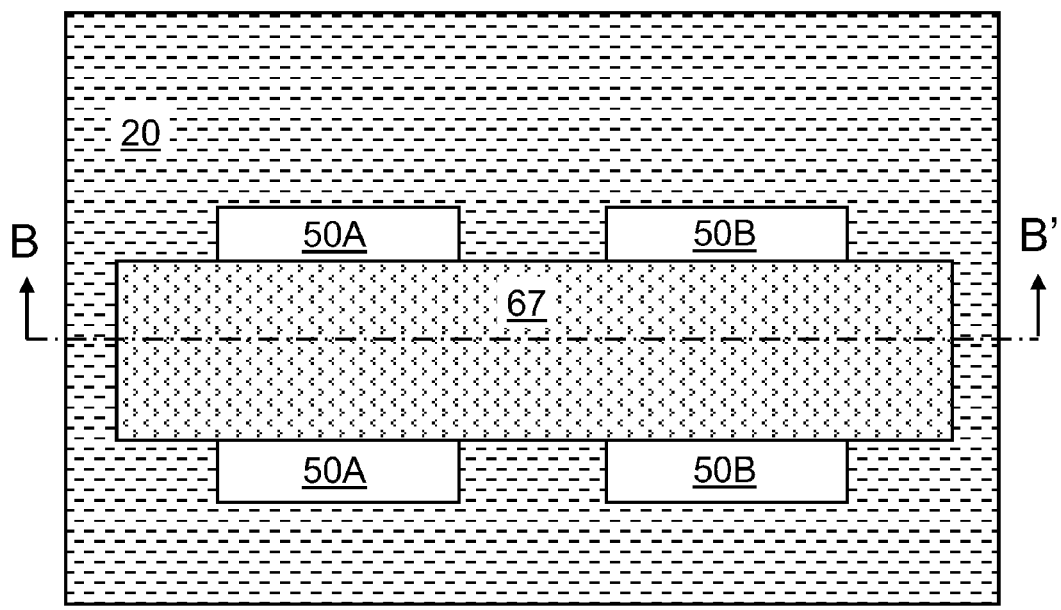
Figure 6B:
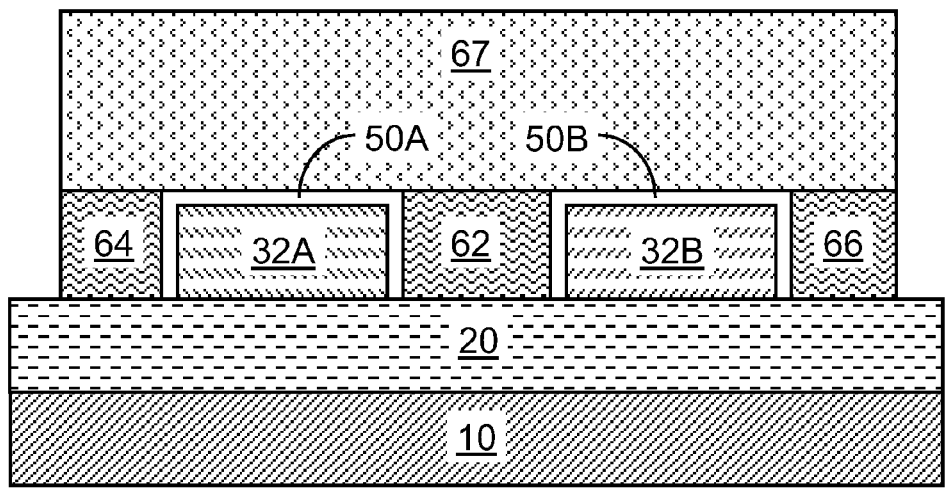

Referring to FIGS. 6A and 6B, a photoresist 67 is applied over the dielectric material layers (50A, 50B) and the buried insulator layer 20, and is lithographically patterned. The pattern in the photoresist 67 is transferred into the conductive material layer 60 to form a plurality of conductive material portions, which include a first conductive material portion 62 that laterally abuts a sidewall of the first dielectric material layer 50A and a sidewall of the second dielectric material layer 50B, a second conductive material portion 64 that laterally abuts another sidewall of the first dielectric material layer 50A, and a third conductive material portion 66 that abuts another sidewall of the second dielectric material layer 50B. Each of the first, second, and third conductive material portions (62, 64, 66) vertically abut the buried insulator layer 20.

Figure 7A:
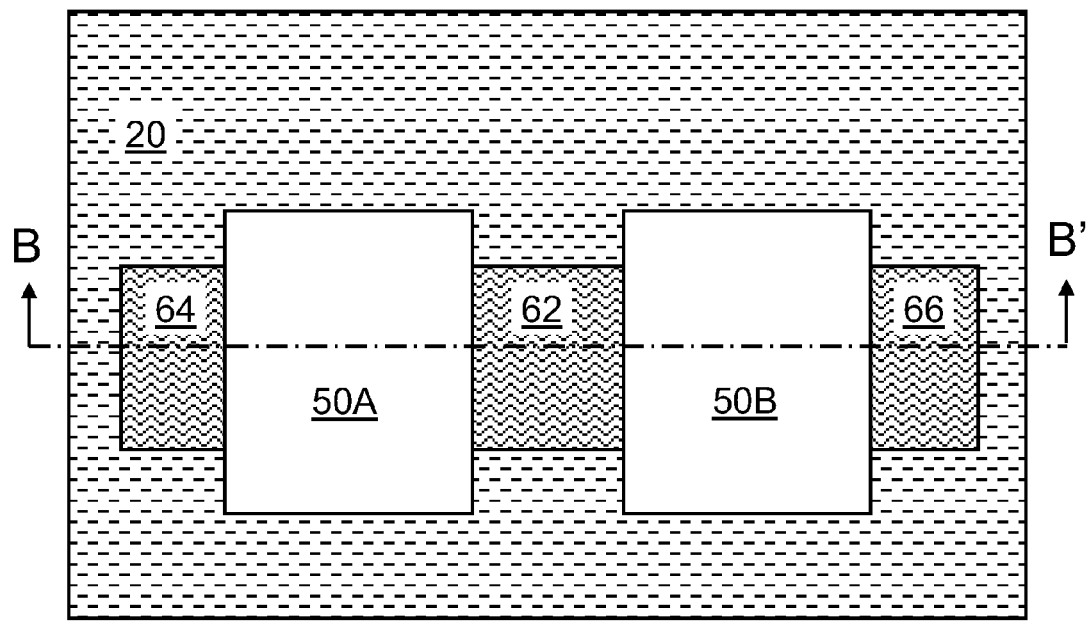
Figure 7B:
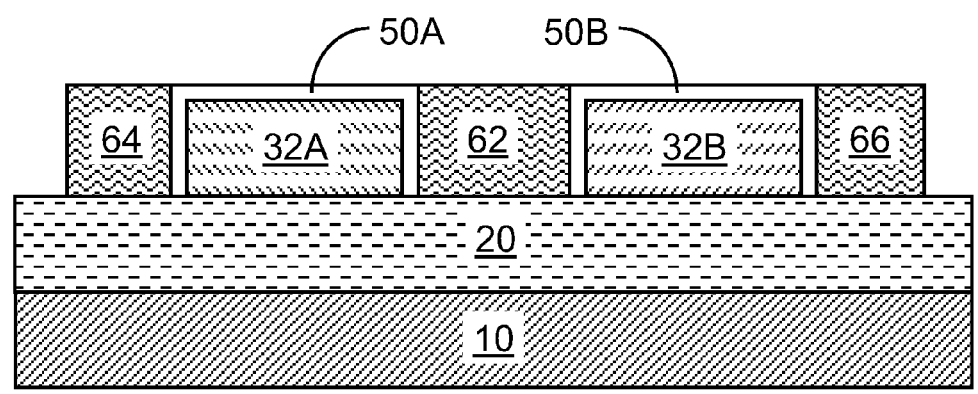

Referring to FIGS. 7A and 7B, the photoresist 67 is subsequently removed. One portion of the first dielectric material layer 50A laterally abuts the first conductive material portion 62, and another portion of the first dielectric material layer 50A laterally abuts the second conductive material portion 64. The first dielectric material layer 50A further comprises portions that do not abut any conductive material portion. One portion of the second dielectric material layer 50B laterally abuts the first conductive material portion 62, and another portion of the second dielectric material layer 50B laterally abuts the third conductive material portion 66. The second dielectric material layer 50B further comprises portions that do not abut any conductive material portion.

Figure 8A:
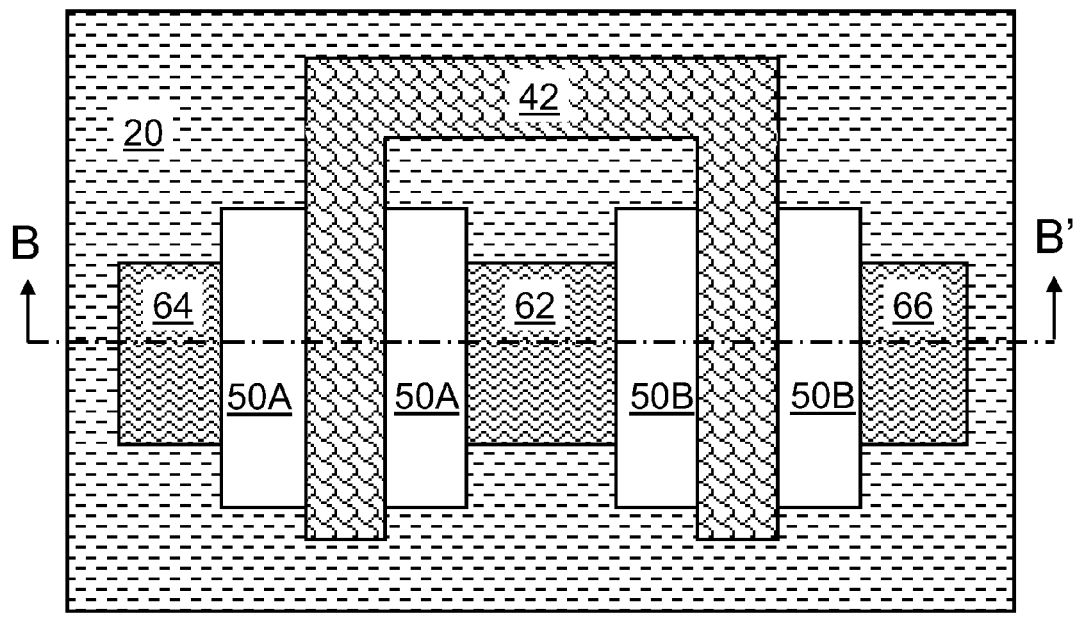
Figure 8B:
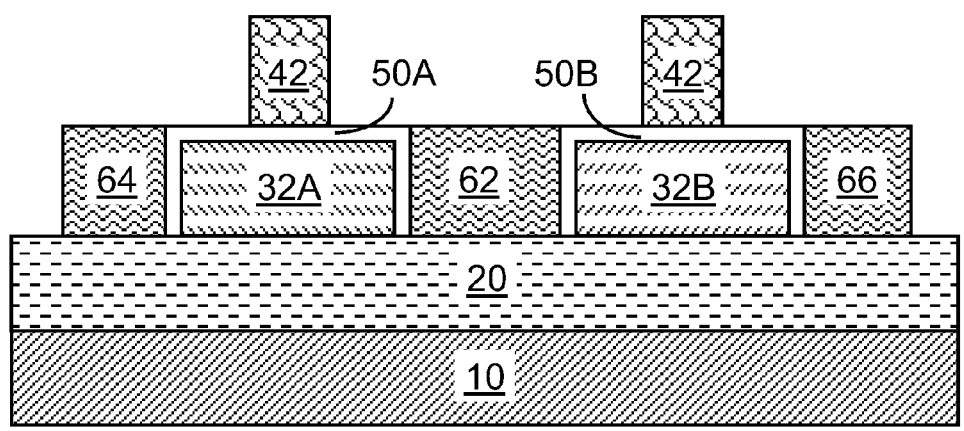

Referring to FIGS. 8A and 8B, a gate conductor layer (not shown) comprising a conductive material is deposited on the top surface of the first exemplary semiconductor structure, which include top surfaces and sidewall surfaces of the dielectric material layers (50A, 50B), the top surfaces and sidewall surfaces of the various conductive material portions including the first, second, and third conductive material portions (62, 64, 66), and the exposed top surfaces of the buried insulator layer 20. In case the gate conductor layer comprises a different material than the material of the first through third conductive material portions (62, 64, 66), the material of the gate conductor layer may be removed selective to the material of the first through third conductive material portions (62, 64, 66). In case the gate conductor layer comprises the same material as the first through third conductive material portions (62, 64, 66), the etch of the gate conductor layer may be end-pointed based on exposure of the top surfaces of the dielectric material layers (50A, 50B).

The gate conductor layer is lithographically patterned to form a gate conductor 42 overlying a middle portion of the first semiconductor portion 32A and a middle portion of the second semiconductor portion 32B. The gate conductor is a contiguous structure of unitary construction. The gate conductor 42 vertically abuts a portion of the top surface of the first dielectric material layer 50A, a sidewall of the first dielectric material layer 50A, a contiguous portion of the top surface of the buried insulator layer 20, a sidewall of the second dielectric material layer 50B, and a portion of the top surface of the second dielectric material layer 50B.

The gate conductor 42 comprises a conductive material such as a doped semiconductor material, a conductive metallic nitride, a metallic material, or a combination thereof. Exemplary doped semiconductor materials include doped polysilicon, a doped silicon-containing semiconductor alloy, etc. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The thickness of the gate conductor 42 may be from about 20 nm to about 300 nm, and typically from about 40 nm to about 120 nm, although lesser and greater thicknesses are also contemplated herein explicitly.

Figure 9A:
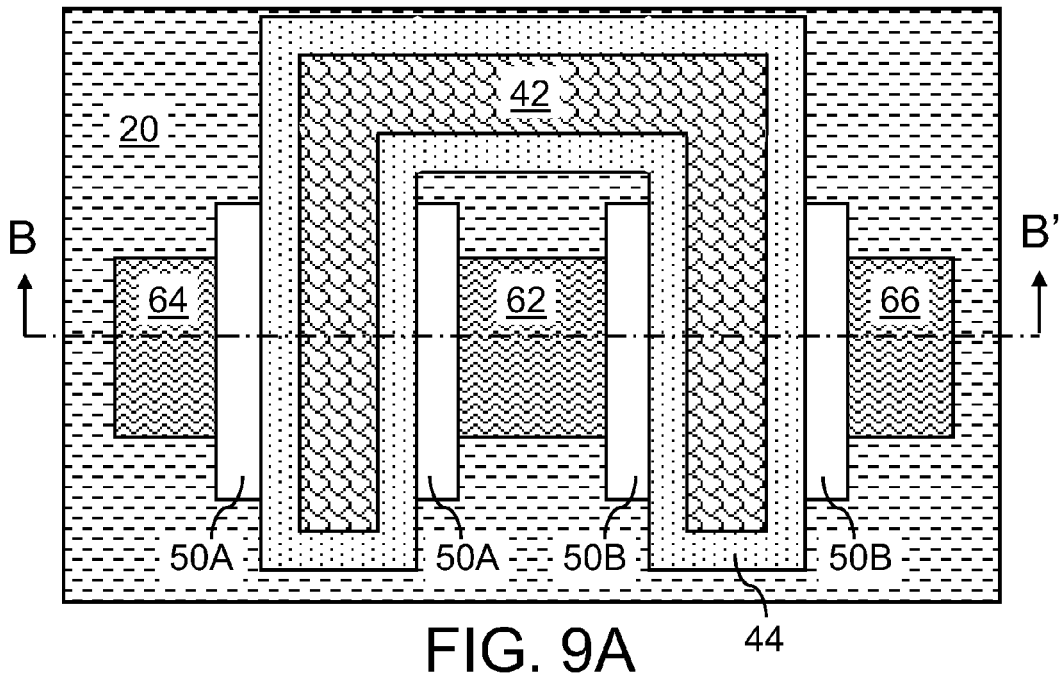
Figure 9B:
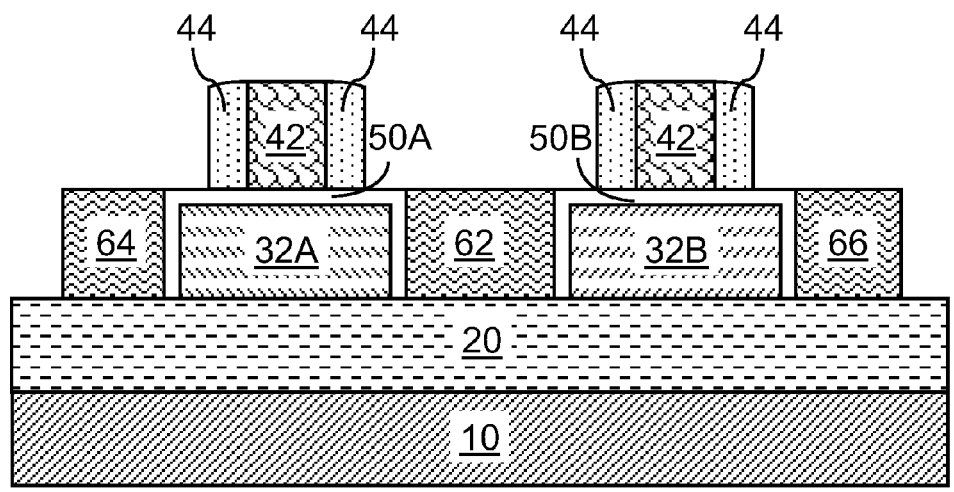

Referring to FIGS. 9A and 9B, a dielectric gate spacer 44 is formed on the sidewalls of the gate conductor 42 by deposition of a conformal dielectric layer and an anisotropic etch that removes horizontal portions of the conformal dielectric layer. The remaining portion of the conformal dielectric layer after the anisotropic etch constitutes the dielectric gate spacer 44, which laterally surrounds the gate conductor 42. The dielectric gate spacer 44 may be topologically homeomorphic to a torus, i.e., may be continually stretched and bended into the shape of a torus without forming or destroying singularities such as a hole. Additional dielectric spacers (not shown) may be formed on the sidewalls of the dielectric material layers (50A, 50B) and sidewalls of the first through third conductive material portions (62. 64, 66).

The dielectric gate spacer 44 comprises a dielectric material such as a dielectric oxide, a dielectric nitride, or a dielectric oxynitride. For example, the dielectric gate spacer 44 may comprise silicon oxide, silicon nitride, or silicon oxynitride. Preferably, the removal of the horizontal portions of the conformal dielectric layer is selective to the dielectric material layers (50a, 50B).

Figure 10A:
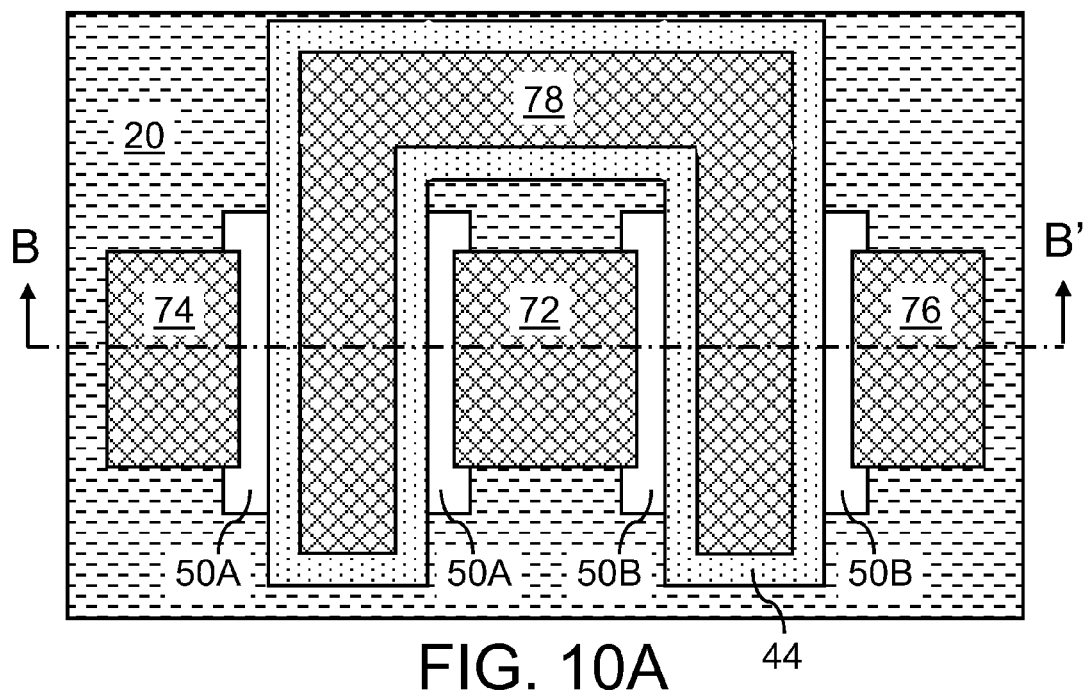
Figure 10B:
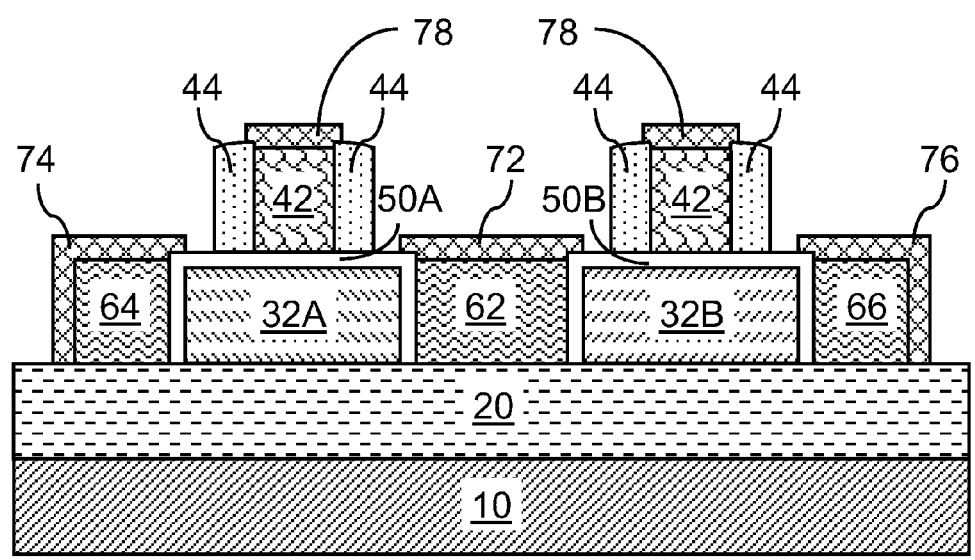

Referring to FIGS. 10A and 10B, metal semiconductor alloy regions are formed on exposed semiconductor surfaces of the first exemplary semiconductor structure. The metal semiconductor alloy regions may be formed, for example, by deposition of a metal layer on the exposed semiconductor surfaces and reacting the metal layer with the semiconductor material underneath. The metal semiconductor alloy regions are formed only on semiconductor surfaces, i.e., if the underlying surface comprises a metal or a dielectric material, no metal semiconductor alloy is formed.

If the first through third conductive material portions (62, 64, 66) comprise a semiconductor material, a first metal semiconductor alloy region 72 is formed directly on the surface of the first conductive material portion 62, a second metal semiconductor alloy region 74 is formed directly on the surface of the second conductive material portion 64, and a third metal semiconductor alloy region 76 is formed directly on the surface of the third conductive material portion 66. The first, second, and third metal semiconductor alloy regions vertically abut the top surface of the buried insulator layer 20. Portions of the first metal semiconductor alloy region 72 overlie a peripheral portion of the first dielectric material layer 50A and a peripheral portion of the second dielectric material layer 50B. A portion of the second metal semiconductor alloy region 74 overlies a peripheral portion of the first dielectric material layer 50A. A portion of the third metal semiconductor alloy region 76 overlies a peripheral portion of the second dielectric material layer 50B.

If the gate conductor 42 comprises a semiconductor material, a gate-side metal semiconductor alloy region 78 is formed directly on the top surface of the gate conductor 42. The gate-side metal semiconductor alloy region 78 abuts the dielectric gate spacer 44.

Figure 11A:
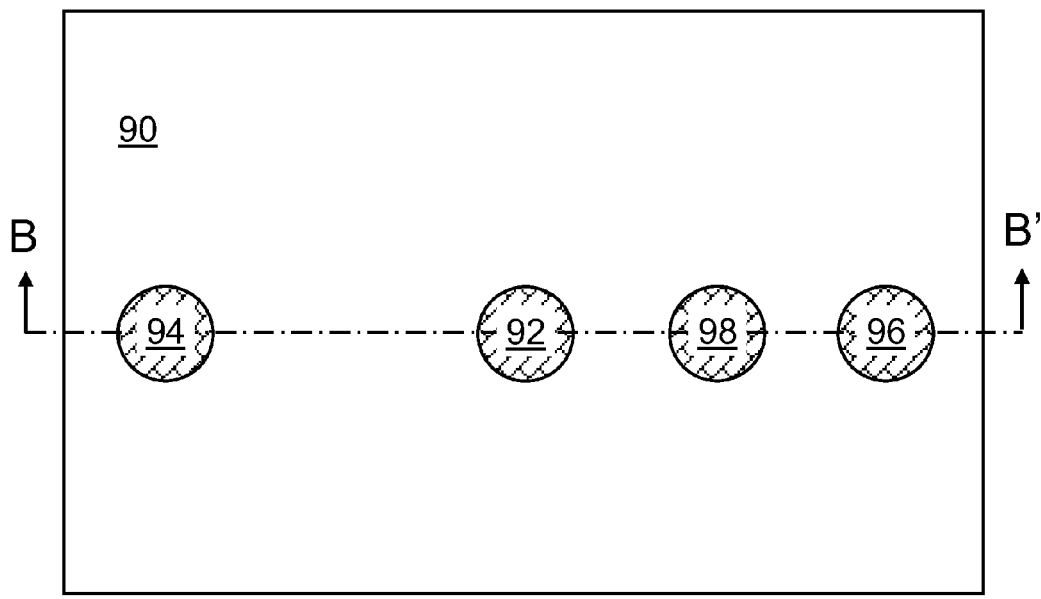
Figure 11B:
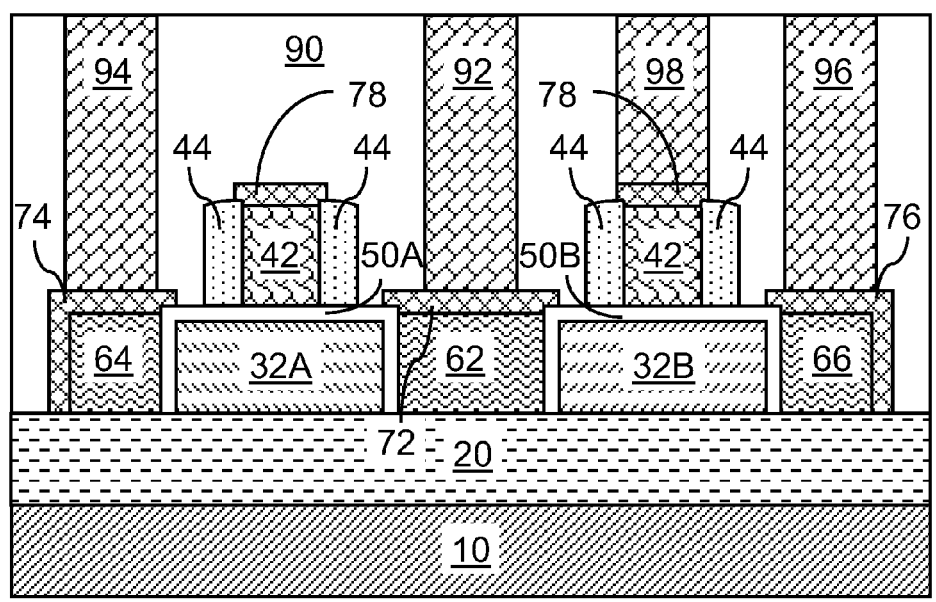

Referring to FIGS. 11A and 11B, a middle-of-line (MOL) dielectric layer 90 is formed over the gate-side metal semiconductor alloy region 78, the first through third metal semiconductor alloy regions (72, 74, 76), the exposed portions of the dielectric material layers (50A, 50B), the outer surfaces of the dielectric gate spacers 44, and exposed portions of the top surface of the buried insulator layer 20. The MOL dielectric layer 90 may comprise a silicon oxide, a silicon nitride, a chemical vapor deposition (CVD) low-k dielectric material, a spin-on low-k dielectric material, or a stack thereof. The MOL dielectric layer 90 may contain a mobile ion diffusion barrier layer that prevents diffusion of mobile ions such as sodium and potassium from back-end-of-line (BEOL) dielectric layers. Further, the MOL dielectric layer 90 may contain a stress liner that applies tensile or compressive stress on underlying structures to alter charge carrier mobility in the semiconductor portions (32A, 32B).

Contact via holes are formed in the MOL dielectric layer 90 and filled with metal to form various metal contacts. For example, a first contact via 92 vertically abutting the first metal semiconductor alloy portion 72, a second contact via 94 vertically abutting the second metal semiconductor alloy region 74, and a third contact via 96 vertically abutting the third metal semiconductor alloy region 76 may be formed. Further, a gate-side contact via 98 vertically abutting the gate-side metal semiconductor alloy region 78 may be formed.

The first semiconductor portion 32A and the second semiconductor portion 32B function as quantum dot structures having an opposite type of doping. For example, the first semiconductor portion 32A may have a p-type doping, and the second semiconductor structure 32B may have an n-type doping. In this case, the first semiconductor portion 32A, the first conductive material portion 62, the second conductive material portion 64, and the gate conductor 42 function in a manner similar to a p-doped body, a source region, a drain region, and a gate of a p-type field effect transistor, respectively. The second semiconductor portion 32B, the first conductive material portion 62, the third conductive material portion 66, and the gate conductor 42 function in a manner similar to an n-doped body, a source region, a drain region, and a gate of an n-type field effect transistor, respectively. Collectively, the first exemplary semiconductor structure function as an inverter, in which a potential difference between the second via contact 94 and the third via contact 96 is maintained by a power supply system so that the voltage at the second via contact 94 is more positive than the voltage at the third via contact 96, an input voltage is applied to the gate-side via contact 98, and an output voltage is generated at the first via contact 92.

The first semiconductor portion 32A, the first conductive material portion 62, the second conductive material portion 64, and the gate conductor 42 collectively function as a first switch that turn on when the voltage on the gate conductor 42 is "low" or relatively negative, and turns off when the voltage on the gate conductor 42 is "high" or relatively positive. The second semiconductor portion 32B, the first conductive material portion 62, the third conductive material portion 66, and the gate conductor 42 function as a second switch that turns on when the voltage on the gate conductor 42 is "high," and turns off when the voltage on the gate conductor 42 is "low." The inverter comprises a serial connection of the first switch and the second switch. When the first switch is turns on, a tunneling current flows through a first portion of the first dielectric material layer 50A between the first conductive material portion 62 and the first semiconductor portion 32A and through a second portion of the first dielectric material layer 50A between the first semiconductor portion 32A and the second conductive material portion 64. When the second switch is turns on, a tunneling current flows through a first portion of the second dielectric material layer 50B between the first conductive material portion 62 and the second semiconductor portion 32B and through a second portion of the second dielectric material layer 50A between the second semiconductor portion 32B and the third conductive material portion 66. Since the electrical current through each switch in an on-state is determined by the tunneling current through portions of the first dielectric material layer 50A or through portions of the second dielectric material layer 50B, the first exemplary semiconductor structure of the present invention provides a low current, low leakage switch that may operate at a low operating voltage, e.g., at operating voltages less than 0.9 V, and even below 0.6 V.

Figure 12:
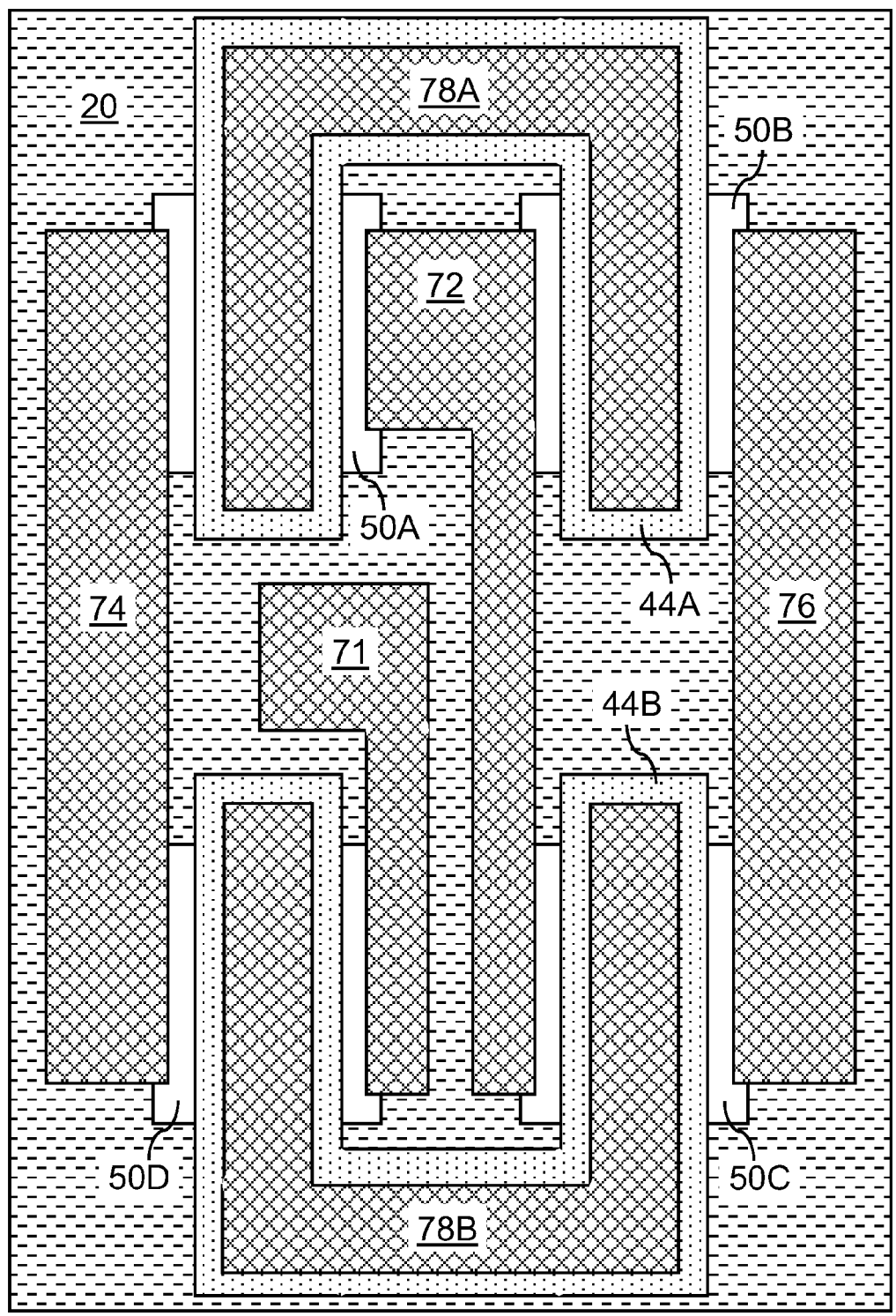
FIG. 12 is a top-down view of a second exemplary semiconductor structure according to the present invention at a step corresponding to FIGS. 9A and 9B.

Referring to FIG. 12, a second exemplary semiconductor structure of the present invention is shown at a step corresponding to FIGS. 10A and 10B. The second exemplary semiconductor structure includes a first dielectric material layer 50A located on the top surface and sidewalls of a first semiconductor portion (not shown), a second dielectric material layer 50B located on the top surface and sidewalls of a second semiconductor portion (not shown), a third dielectric material layer 50C located on the top surface and sidewalls of a third semiconductor portion (not shown), and a fourth dielectric material layer 50D located on the top surface and sidewalls of a fourth semiconductor portion (not shown). Each of the first through fourth semiconductor portions may have the same composition and thickness as the first or second semiconductor portions (32A, 32b) of the first exemplary semiconductor structure. Each of the first through fourth dielectric material layers (50A, 50B, 50C, and 50D) may have the same composition and thickness as the first or second dielectric material layers (50A, 50B) of the first exemplary semiconductor structure.

A stack of a first gate conductor (not shown) of unitary construction and a first gate-side metal semiconductor alloy region 78A straddles a middle portion of the first and second semiconductor portions. A stack of a second gate conductor (not shown) of unitary construction and a second gate-side metal semiconductor alloy region 78B straddles a middle portion of the third and fourth semiconductor portions. Each of the first and second gate conductors may comprise the same material as, and have the same thickness as, the gate conductor 42 of the first exemplary semiconductor structure. Each of the first and second gate-side metal semiconductor alloy regions (78A, 78B) may have the same composition and thickness the gate-side metal semiconductor alloy region 78 of the first exemplary semiconductor structure.

A first conductive material portion (not shown) underlying a first metal semiconductor alloy region 72 abuts a sidewall of the first dielectric material layer 50A, a sidewall of the second dielectric material layer 50B, and a sidewall of the third dielectric material layer 50C. A second conductive material portion (not shown) underlying a second metal semiconductor alloy region 74 abuts another sidewall of the first dielectric material layer 50A and a sidewall of the fourth dielectric material layer 50D. A third conductive material portion (not shown) underlying a third metal semiconductor alloy region 76 abuts another sidewall of the second dielectric material layer 50B and a sidewall of the third dielectric material layer 50C. A fourth conductive material portion (not shown) underlying a fourth metal semiconductor alloy region 71 abuts a sidewall of the fourth dielectric material layer 50D. Each of the first through fourth conductive material portions may have the same composition and thickness as one of the first through third conductive material portions (62, 64, 66) of the first exemplary semiconductor structure. The fourth metal semiconductor alloy region 71 may have the same composition and thickness as the first through third metal semiconductor alloy regions (72, 74, 76).

The first semiconductor portion underlying the first dielectric material layer 50A and the fourth semiconductor portion underlying the fourth dielectric material layer 50D have a doping of the first conductivity type. The second semiconductor portion underlying the second dielectric material layer 50B and the third semiconductor portion underlying the third dielectric material layer 50C have a doping of the second conductivity type, i.e., the opposite of the first conductivity type.

The third metal semiconductor alloy region 76 functions as a first power supply node, and the fourth metal semiconductor alloy region 71 functions as a second power supply node. The first gate-side metal semiconductor alloy region 78A functions as a first input node, and the second gate-side metal semiconductor alloy region 78B functions as a second input node. The first metal semiconductor alloy region 72 functions as an output node.

In one configuration, the first conductivity type is n-type and the second conductivity type is p-type. In other words, the second semiconductor portion and the third semiconductor portion have a p-type doping, and the first semiconductor portion and the fourth semiconductor portion have an n-type doping. The voltage at the first power supply node, i.e., the voltage at the third metal semiconductor alloy region 76, is maintained at a positive voltage relative to the voltage at the second power supply node, i.e., the voltage at the fourth metal semiconductor alloy region 71. In this case, the second exemplary semiconductor structure functions as a logical NAND gate, of which the output at the output node of the first metal semiconductor alloy region 72 is the same as the result of an NAND operation of the two inputs to the first gate-side metal semiconductor alloy region 78A and the second gate-side metal semiconductor alloy region 78B.

In another configuration, the first conductivity type is p-type and the second conductivity type is n-type. In other words, the second semiconductor portion and the third semiconductor portion have an n-type doping, and the first semiconductor portion and the fourth semiconductor portion have a p-type doping. The voltage at the first power supply node is maintained at a negative voltage relative to the voltage at the second power supply node. In this case, the second exemplary semiconductor structure functions as a logical NOR gate, of which the output at the output node of the first metal semiconductor alloy region 72 is the same as the result of an NOR operation of the two inputs to the first gate-side metal semiconductor alloy region 78A and the second gate-side metal semiconductor alloy region 78B.

Other logic gates may be formed in a similar manner. In such semiconductor structures, the on-current of the semiconductor device is determined by a tunneling current through at least one quantum dot structure so that a low current, low voltage operation is achieved.

Figure 13:
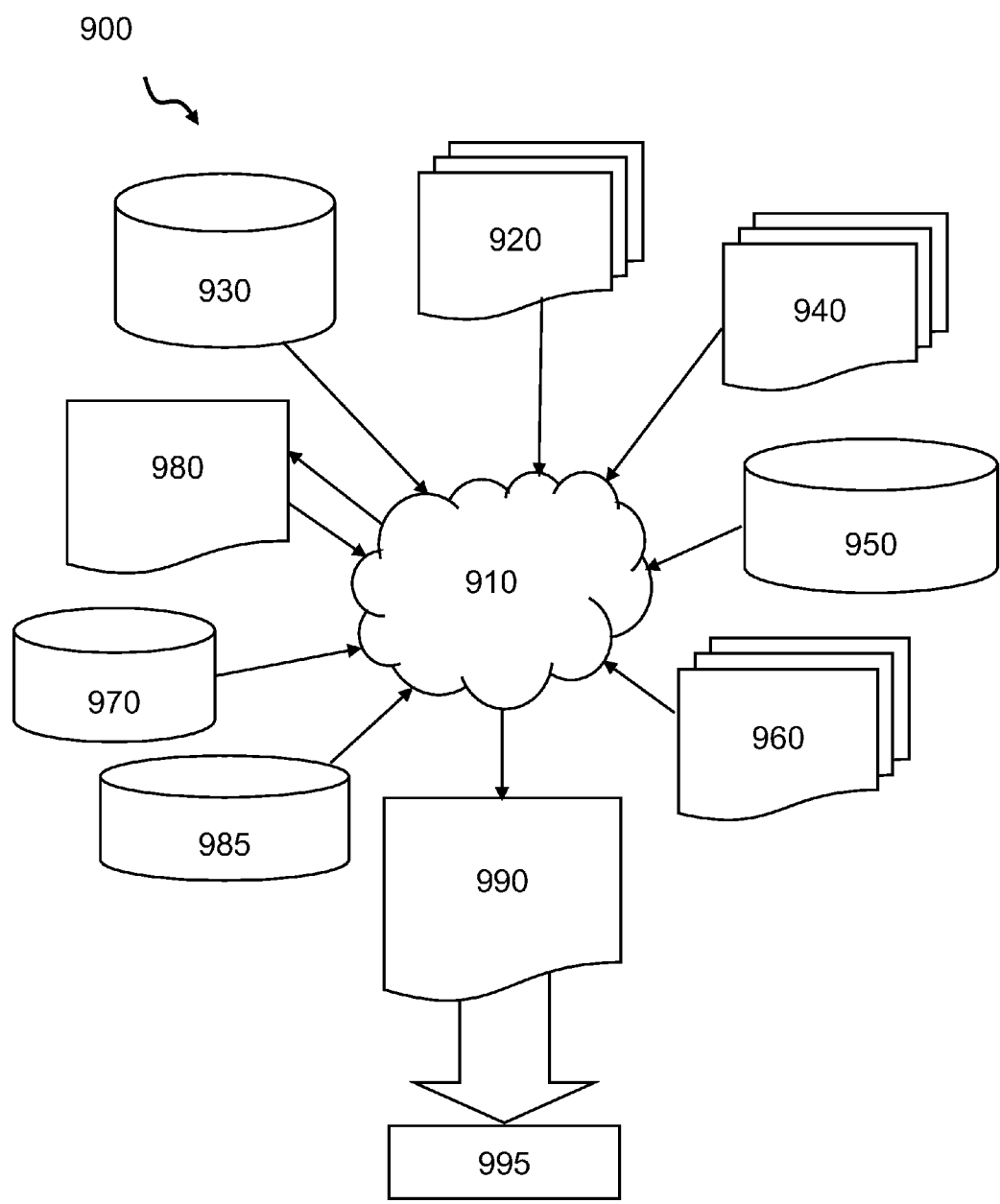
FIG. 13 is a flow diagram of a design process that may be used in design and manufacture of the semiconductor devices and circuits according to the present invention.

FIG. 13 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-12. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 13 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-12. In one embodiment, design structure 990 may comprise a compiled, executable HDL simulation model that functionally simulates the devices shown in FIGS. 1-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-12. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:

forming first and second semiconductor portions, each including at least one dopant atom, on an insulator layer;

forming a first dielectric material layer directly on said first semiconductor portion and a second dielectric material layer directly on said second semiconductor portion, wherein said insulator layer and said first dielectric material layer encapsulate said first semiconductor portion, and wherein said insulator layer and said second dielectric material layer encapsulate said second semiconductor portion;

depositing a conductive material layer directly on said first and second dielectric material layers;

planarizing said conductive material layer employing a top surface of said first dielectric material layer and a top surface of said second dielectric material layer as a stopping layer;

forming a conductive material portion directly on a portion of said first dielectric material layer and a portion of said second dielectric material layer, wherein said first and second dielectric material layers have a thickness less than 2 nm to enable quantum tunneling of electrical current into or from said conductive material portion; and forming a gate conductor of unitary construction directly on a top surface of said first dielectric material layer, a top surface of said second dielectric material layer, and a top surface of said insulator layer.

2. The method of claim 1, wherein said first dielectric material layer laterally abut all sidewalls of said first semiconductor portion, and wherein said second dielectric material layer laterally abut all sidewalls of said second semiconductor portion.

3. The method of claim 1, further comprising:
forming a gate conductor layer directly on said first dielectric material layer and said conductive material portion; and
lithographically patterning said gate conductor layer to form said gate conductor.

4. The method of claim 3, wherein said gate conductor layer and said conductive material portion comprise different materials, and wherein an anisotropic etch that removes a material of said gate conductor layer selective to said conductive material portion are employed during said lithographic patterning of said gate conductor layer.

5. The method of claim 3, further comprising forming a dielectric gate spacer directly on sidewalls of said gate conductor, wherein said dielectric gate spacer abuts and overlies said first dielectric material layer, said second dielectric material layer, and said insulator layer and laterally surrounds said gate conductor.

6. A method of forming a semiconductor structure comprising:
forming first and second semiconductor portions, each including at least one dopant atom, on an insulator layer;
forming third and fourth semiconductor portions, each including at least one dopant atom, on said insulator layer;
forming a first dielectric material layer directly on said first semiconductor portion and a second dielectric material layer directly on said second semiconductor portion, wherein said insulator layer and said first dielectric material layer encapsulate said first semiconductor portion, and wherein said insulator layer and said second dielectric material layer encapsulate said second semiconductor portion;

forming a third dielectric material layer directly on said third semiconductor portion and a fourth dielectric material layer directly on said fourth semiconductor portion, wherein said insulator layer and third dielectric material layer encapsulate said third semiconductor portion, and wherein said insulator layer and said fourth dielectric material layer encapsulate said fourth semiconductor portion;

forming a conductive material portion directly on a portion of said first dielectric material layer and a portion of said second dielectric material layer, wherein said first and second dielectric material layers have a thickness less than 2 nm to enable quantum tunneling of electrical current into or from said conductive material portion;

forming a gate conductor of unitary construction directly on a top surface of said first dielectric material layer, a top surface of said second dielectric material layer, and a top surface of said insulator layer; and forming another gate conductor directly on a top surface of said third dielectric material layer, a top surface of said fourth dielectric material layer, and a top surface of said insulator layer.

7. The method of claim 6, further comprising:
forming a second conductive material portion directly on a said first dielectric material layer; and
forming a third conductive material portion directly on said third dielectric material layer.

8. The method of claim 7, wherein said conductive material portion, said second conductive material portion, and said third conductive material portion comprise a same conductive material, and are formed simultaneously by lithographic patterning of a conductive material layer.

9. The method of claim 7, further comprising:
forming a first metal semiconductor alloy directly on said conductive material portion;
forming a second metal semiconductor alloy region directly on said second conductive material portion;
forming a third metal semiconductor alloy region directly on said third conductive material portion; and
forming a gate-side metal semiconductor alloy region directly on said gate conductor.

10. The method of claim 6, wherein said conductive material portion abuts a portion of said third dielectric material layer and does not abut said fourth dielectric material layer, wherein said second conductive material portion abuts a portion of said fourth dielectric material layer and does not abut said third dielectric material layer, and wherein said third conductive material portion abuts another portion of said third dielectric material layer.

11. The method of claim 10, further comprising forming an additional conductive material portion directly on another portion of said fourth dielectric material layer, wherein said additional conductive material portion does not abutting said first, second, or third dielectric material layer.

12. The method of claim 6, further comprising:
depositing a conductive material layer directly on said first and second dielectric material layers; and
planarizing said conductive material layer employing a top surface of said first dielectric material layer and a top surface of said second dielectric material layer as a stopping layer.

* * * * *